US008277960B2

(12) United States Patent
Casper et al.

(10) Patent No.: US 8,277,960 B2
(45) Date of Patent: Oct. 2, 2012

(54) INHOMOGENEOUS COMPOUNDS HAVING HIGH MAGNETIC RESISTANCE, THE PRODUCTION AND USE THEREOF

(75) Inventors: Frederick Casper, Mainz (DE); Claudia Felser, Mainz (DE)

(73) Assignee: Johannes Gutenberg-Universität Mainz, Mainz (DE)

( * ) Notice: Subject to any disclaimer, the term of this patent is extended or adjusted under 35 U.S.C. 154(b) by 212 days.

(21) Appl. No.: 12/992,987

(22) PCT Filed: May 20, 2009

(86) PCT No.: PCT/EP2009/003599
§ 371 (c)(1),
(2), (4) Date: Nov. 16, 2010

(87) PCT Pub. No.: WO2009/146797
PCT Pub. Date: Dec. 10, 2009

(65) Prior Publication Data
US 2011/0135960 A1    Jun. 9, 2011

(30) Foreign Application Priority Data

May 30, 2008   (DE) .................. 10 2008 026 241

(51) Int. Cl.
*C22C 19/07*    (2006.01)
*B22D 7/00*    (2006.01)
*H01L 29/76*    (2006.01)
*G11B 5/33*    (2006.01)
*G11B 5/127*    (2006.01)
*H01B 1/02*    (2006.01)
*H01F 1/22*    (2006.01)

(52) U.S. Cl. ..... 428/812; 360/110; 360/324; 428/692.1; 257/295; 204/298.13; 252/512; 264/613

(58) Field of Classification Search .................. None
See application file for complete search history.

(56) References Cited

U.S. PATENT DOCUMENTS

| | | | |
|---|---|---|---|
| 6,569,811 B1* | 5/2003 | Shi | 505/400 |
| 2004/0113188 A1* | 6/2004 | Schmidt et al. | 257/295 |
| 2004/0114283 A1* | 6/2004 | Felser | 360/324 |
| 2004/0207961 A1* | 10/2004 | Ichimura et al. | 360/324.2 |
| 2005/0149169 A1* | 7/2005 | Wang et al. | 623/1.15 |
| 2005/0218882 A1* | 10/2005 | Ludwig et al. | 324/117 R |
| 2007/0096228 A1* | 5/2007 | Ahn et al. | 257/421 |
| 2008/0063557 A1* | 3/2008 | Ishida et al. | 420/580 |
| 2008/0173543 A1* | 7/2008 | Ziani | 204/298.13 |
| 2008/0174400 A1* | 7/2008 | Chen et al. | 338/32 R |
| 2011/0084429 A1* | 4/2011 | Felser | 264/613 |

FOREIGN PATENT DOCUMENTS

DE      3820475 C1    12/1989
(Continued)

OTHER PUBLICATIONS

English language Abstract of DE 10157172 A1; PUB-No. DE010157172A1 (pub. 2003).*

(Continued)

*Primary Examiner* — Kevin Bernatz
(74) *Attorney, Agent, or Firm* — ProPat, L.L.C.

(57) ABSTRACT

The invention relates to inorganic, intermetallic, inhomogeneous compounds having a magnetic resistance effect and an intrinsic field sensitivity of at least 7% at 1 T at room temperature. The invention further relates to a method for the production and use thereof, particularly as magnetic field sensors or in spin electronics.

13 Claims, 3 Drawing Sheets

FOREIGN PATENT DOCUMENTS

| | | | |
|---|---|---|---|
| DE | 10157172 A1 | * | 6/2003 |
| JP | 2008 072060 A | | 3/2008 |

OTHER PUBLICATIONS

Kandpal, H., Felser, C., and Seshadri, R., J. Phys. D: Appl. Phys. 39 (2006), 776-785.*

Helmolt, R., Wecker, J., Holzapfel, B., Schultz, L., and Samwer, K., Phys. Rev. Let., 71(14) (1993), 2331-2333.*

Moussa, J., Ram-Mohan, L., Sullivan, J., Zhou, T., Hines, D., and Solin, A., Phys. Rev. B, 64 (2001), 184410-1-8.*

Solin, S., Thio, T., Hines, D., and Heremans, J., Science, 289 (2000), 1530-1532.*

Sekimoto, T., Kurosaki, K., Muta, H., and Yamanaka, S., App. Phys. Let., 89 (2006), 092108-1-3.*

Casper, F., and Felser, C., Internet (2007), www.arXiv:0709.4182v1, p. 1-3.*

Machine Translation of JP 2008-072060 A (pub. 2008).*

Mengel, S., "Innovationspotential Magnetoelektronik [Innovation Potential of Magnetoelectronics]," Physikalische Blätter, 55(5) 1999, p. 53-55.

von Helmolt, R. et al., Physical Review Letters vol. 71, No. 14 (1993) p. 2331-2333.

Moussa, J. et al., "Finite-element molding of extraordinary magnetoresistance in thin film semiconductors with metallic inclusions," Physical Review B vol. 64 (2001), 184410 p. 1-8.

Xu, R. et al., "Large magnetoresistance in non-magnetic silver chalcogenides" Letters to Nature (1997) vol. 390, p. 57-60.

Kandpal, H.C., et al., "Covalent bonding and the nature of band gaps in some half-Heusler compounds," Journal of Physics D: Appl. Physics 39 (2006), 776-785.

Sekimoto, S., "Ln=La,Gd): Promising intermetallics with large carrier mobility for high performance p-type thermoelectric materials" Applied Physics Letters, AIP, American Institute of Physics, (Aug. 29, 2006) vol. 89, No. 9, p. 92108-1-92108-3.

Solin, S.A. et al., "Enhanced Room-Temperature Geometric Magnetoresistance in Inhomogeneous Narrow-Gap Semiconductors," Science vol. 289 (2000) p. 1530-1532.

Casper, S. et al. "Giant Magnetoresistance and extraordinary magnetoresitance in inhomogeneous semiconducting DyNiBi" Internet (2007), www.arXiv:0709.4182v1 p. 1-3.

* cited by examiner

INHOMOGENEOUS COMPOUNDS HAVING HIGH MAGNETIC RESISTANCE, THE PRODUCTION AND USE THEREOF

CROSS-REFERENCE TO RELATED APPLICATIONS

This application is being filed under Rule 1.371 as a National Stage Application of pending International Application No. PCT/EP2009/003599 filed May 20, 2009 which claims priority to the following parent application: German Patent Application No. 10 2008 026 241.2, filed May 30, 2008. Both International Application No. PCT/EP2009/003599 and German Patent Application No. 10 2008 026 241.2 are hereby incorporated by reference herein in their entirety.

FIELD OF THE INVENTION

The invention relates to inorganic, intermetallic, inhomogeneous compounds having a magnetoresistance effect, with an intrinsic field sensitivity of at least 7% under 1 T at room temperature. The invention furthermore relates to a production method and their use, in particular as magnetic field sensors or in spin electronics.

BACKGROUND OF THE INVENTION

The present invention relates to compounds which are suitable for use in magnetoelectronics. Such compounds, owing to their magnetoresistive properties, can be used inter alia as sensors for magnetic fields. Magnetoresistive properties are intended to mean a change of resistance under the effect of an external magnetic field (magnetoresistance effect).

Magnetic sensors are employed in the magnetic heads of hard disk drives, which are used for example as external storage devices for computers. Conventional magnetic heads detect the strength and direction of a magnetic field on the basis of a current which is induced in coil. When the recording density increases, however, the recording area for a bit decreases and the resulting magnetic fields become progressively weaker. In order to detect such small external magnetic fields, highly sensitive magnetic sensors are required. Magnetic sensors which use a magnetoresistance effect (giant magnetoresistance=GMR effect or tunneling magnetoresistance=TMR effect) are known to be such magnetic sensors with high sensitivity (S. Mengel, Innovationspotential Magnetoelektronik [Innovation Potential of Magnetoelectronics], Physikalische Blatter, 55(5) 1999, p. 53-55).

Magnetoresistance is a quantity which describes the percentage change of the resistance of a system with and without an external magnetic field. Magnetoresistance is defined as the decrease or increase of the electrical resistance under an external magnetic field, relative to the resistance without a magnetic field. In general, two different definitions are used for the percentage magnetoresistance. The definition used here for the percentage magnetoresistance $MR_0$ is given by the difference between the resistance without a field and the resistance with a field, divided by the resistance without a field (in %). The maximum value is 100%. An alternative definition (for example DE-A 38 20 475, whose United States equivalent is U.S. Pat. No. 4,949,039) is used in the case of the so-called GMR (giant magnetoresistance) effect. This effect is found in multi layer systems. In the simplest case, these layer systems consist of two magnetic layers, for example iron, which are separated by a nonmagnetic interlayer, for example chromium. In this case, the percentage magnetoresistance $MR_p$ is given by the difference between the resistance without a field (high resistance, owing to the antiparallel spin orientation of the two magnetic iron layers) and the resistance with a field (low resistance owing to the parallel spin orientation of the two magnetic iron layers) divided by the resistance with a field (parallel spin orientation of the two magnetic iron layers) in %. The maximum value can be arbitrarily large. The GMR effect, which has been known since 1987, is likely to be an interfacial effect (DE-A 38 20 475). Whenever the two iron layers are coupled ferromagnetically via the chromium layer, the resistance is low since the electrons can pass into the second iron layer without changing their spin. In the case of antiferromagnetic coupling between the spins of the two iron layers, on the other hand, the resistance is high.

Ferromagnetism is generally defined as a collective magnetism in which the electron spins are aligned parallel below the critical temperature (Curie temperature). Antiferromagnetism is defined as collective magnetism in which the electron spins are aligned antiparallel below the critical temperature (Néel temperature).

The resistance of a layer system with antiparallel coupling between the iron layers can be reduced significantly by an externally applied magnetic field. The external magnetic field forces ferromagnetic alignment of the spins of the two iron layers in the direction of the field. At most a 10% $MR_0$ effect can be achieved at room temperature by this effect. The GMR effect has already entered technical use, in particular as a magnetic sensor in read heads for hard disk drives (IBM 1997).

The importance of these magnetoresistance materials for magnetic sensors and magnetic data storage has grown immensely in recent years and is already of great commercial importance. Electronics based on electron spin is also on the verge of entering the market. The magnetic materials used in this case are almost exclusively 3d metals (that is to say metals with partially filled 3d orbitals), since these metals exhibit the desired magnetic properties and are substantially compatible with the process techniques in silicon technology. Their principal characteristics, for example the size of the magnetoresistive effect, maximum working temperature (operating temperature of the magnetic sensors), field sensitivity etc. have been improved in recent years, but without an optimal solution having been found for all areas of application.

In 1993, large magnetoresistances were also discovered in compounds (in contrast to layer systems, see above). The "colossal magnetoresistance" CMR effect in manganese oxides has attracted great interest worldwide (R. von Helmolt, J. Wecker, B. Holzapfel, L. Schultz, K. Samwer, Phys. Rev. Lett. 71 (1993) page 2331) since the resistance change when applying an external magnetic field is much more than in layer systems. This CMR effect is an intrinsic effect, and the extremely large resistance change is due to the suppression of a metal-insulator transition at the Curie temperature $T_C$.

The Curie temperature is defined as the critical temperature below which spontaneous magnetization occurs with a parallel arrangement of the spin moments on neighboring atoms, also referred to as a ferromagnetic arrangement. Above $T_C$, the spins are disordered and the compounds which exhibit a CMR effect are insulators (semiconductors), while below $T_C$ these compounds are ferromagnetic metals. The effect is therefore usually greatest at the Curie temperature. A technological application is also sought in this case, although the greatest effect is usually found at temperatures below room temperature (not in the operating temperature range of read heads).

In 2000, the so-called EMR effect (extraordinary magnetoresistance) was discovered. It is a geometrical effect, in which the magnetic field prevents the flow of electrons between a semiconductor and a metal. This effect was shown for the first time on indium-antinomy van der Pauw disks which have gold embedded in the middle (S. A. Solin, T. Thio, D. R. Hines, J. J. Heremans, Science 289 (2000) 1530). With a zero field, the current flows primarily through the gold (the metallic "inhomogeneity"), but when there is an applied magnetic field, the electrons can no longer pass from the indium-antimony semiconductor into the gold. This leads to high magnetoresistances, even though the materials themselves show no physical magnetoresistance. In contrast to the GMR and CMR effects, the EMR effect is always positive, i.e. the resistance increases in the magnetic field. The application potential of EMR components has already been studied (J. Moussa, L. R. Ram-Mohan, J. Sullivan, T. Zhou, D. R. Hines, S. A. Solin, Phys. Rev. B 64 (2001), 184410), but it is not yet important in contemporary magnetoelectronics.

A feature common to all the magnetic field sensors mentioned so far is that they have to be produced elaborately in a plurality of process steps. TMR and GMR sensors consist of a system of thin layers of different materials. These thin layers are produced for example by sputtering, laser ablation or molecular beam epitaxy (MBE), or are vapor deposited (see for example S. Falk, dissertation, Mainz, 2004). EMR sensors consist of a metallic material embedded in a semiconductor material (S. A. Solin, T. Thio, D. R. Hines, J. J. Heremans, Science (2000) 289, 1530).

Recently, inhomogeneous semiconductor compounds of the half-Heusler type have been reported (Los Alamos National Laboratory, Preprint Archive, Condensed Matter (2007), 1-3, arXiv:0709.4182v1) which likewise exhibit a GMR and EMR effect. These inhomogeneous compounds are produced by adding, to the stoichiometric composition, an excess of a metal which the compound comprises and which is distributed randomly as "islands" in the matrix of the compound; complicated encapsulation or embedding which is elaborate in terms of processing technology, as in the In—Sb with embedded Au, is obviated here. However, the described inhomogeneous half-Heusler compounds have the disadvantage that the resistance effect on the one hand occurs only at very low temperatures (10-100 K) and on the other hand—which is more important—the percentage resistance change is negative.

Furthermore, nonstoichiometric compounds which have a high positive magnetoresistance are known—$Ag_{2+\delta}Se$ and $Ag_{2+\delta}Te$ (R. Xu, A. Husmann, T. F. Rosenbaum, M.-L. Saboungi, J. E. Enderby, P. B. Littlewood, Nature (1997) 390, 57). Here, however, production is much more difficult and involves working with highly toxic materials.

SUMMARY OF ADVANTAGEOUS EMBODIMENTS OF THE INVENTION

It was an object of the present invention to provide materials having an effect, selected from GMR, TMR, EMR and CMR effects, which obviate the elaborate process of structuring magnetic sensors (layer fabrication, metal embedding) and exhibit a stable resistance effect with the greatest possible field sensitivity close to room temperature (23° C.), the percentage resistance change being positive.

DETAILED DESCRIPTION OF ADVANTAGEOUS EMBODIMENTS OF THE INVENTION

Figure 1:
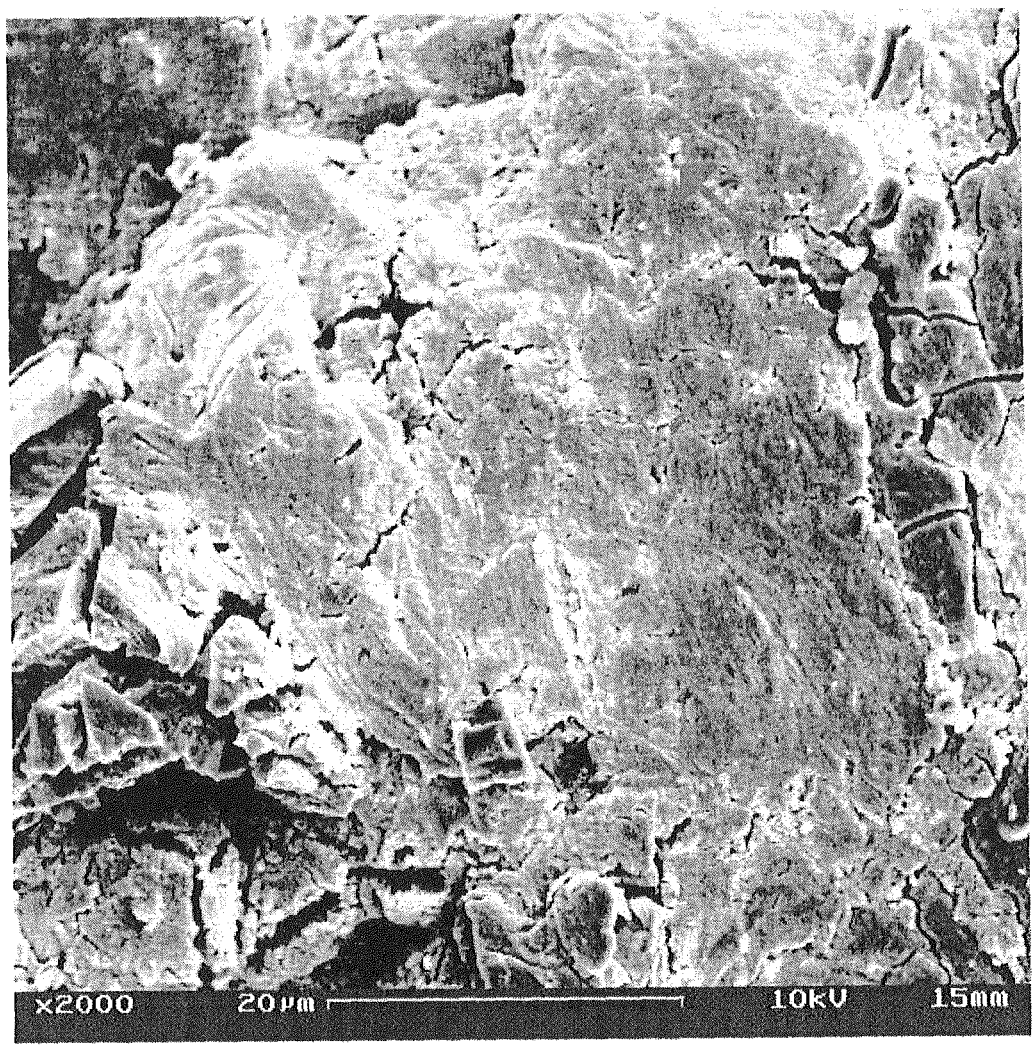
FIG. 1 is an SEM image of an exemplary LuNiBi/Bi-excess compound.

The present invention achieves this object and provides compounds which have the aforementioned properties. These compounds belong to the half-Heusler phases.

Compounds of the half-Heusler phases consist of 3 elements (X, Y, Z) per formula unit. If a half-Heusler phase has 8 or 18 valence electrons, then it is at least a semiconductor (H. C. Kandpal, C. Felser, R. Seshadri, J. Phys. D: Appl. Phys 39 (2006), 776). The elements may also be substituted by elements with the same valence electron number. The f electrons of the lanthanides and actinides do not count as valence electrons here. If there are metallic inclusions in these semiconductors, then a high magnetoresistance can occur. Yet if the compounds exhibit a ferro-, ferri- or antiferromagnetic behavior, then in these compounds a negative effect clearly predominates below the temperature range of commercial interest (room temperature), as in the case for example of inhomogeneous DyNiBi (Los Alamos National Laboratory, Preprint Archive, Condensed Matter (2007), 1-3, arXiv: 0709.4182v1). The compounds according to the invention, on the other hand, exhibit no magnetic order; they are paramagnetic.

Half-Heusler phases are intermetallic compounds of the general composition XYZ and crystallize in the AlLiSi structure (Pearson's Handbook of Crystallographic Data for Intermetallic Phases, ASM International, The Materials Society, 1991). Intermetallic compounds are intended to mean compounds 1. between two or more true metals (T1 and T2),
2. between one or more true metals and one or more metals of subgroup B or
3. between two or more metals of subgroup B, the properties becoming less metallic and increasingly similar to true chemical compounds when progressing from class 1 to class 3. The classification into true metals and elements of subgroup B has been based on Table 13.1 of R. C. Evans (Einfuhrung in die Kristallchemie [Introduction to Crystal Chemistry], Walter de Gruyter Verlag Berlin, New York 1976, p. 276):

TABLE

| True metals | | | | | | | | | | | Elements of subgroup B | | | | |
|---|---|---|---|---|---|---|---|---|---|---|---|---|---|---|---|
| T1 | | T2 | | | | | | | | | B1 | | B2 | | |
| Li | Be | | | | | | | | | | | | | | |
| Na | Mg | | | | | | | | | | Al | Si | | | S |
| K | Ca | Sc | Ti | V | Cr | Mn | Fe | Co | Ni | Cu | Zn | Ga | Ge | As | Se |
| Rb | Sr | Y | Zr | Nb | Mo | Tc | Ru | Rh | Pd | Ag | Cd | In | Sn | Sb | Te |
| Cs | Ba | La | Hf | Ta | W | Re | Os | Ir | Pt | Au | Hg | Tl | Pb | Bi | Pb |

The metals of the lanthanum and actinium series belong to class T2.

The cubic structure of the AlLiSi type is distinguished by three interpenetrating lattices. X and Y are usually transition metals (T2 in the table above). The magnetic properties of most known half-Heusler phases have been studied very thoroughly. Half-Heusler phases having more or fewer than 8 or 18 valence electrons are usually magnetic metals.

Since only one tetrahedral position is occupied in the half-Heusler structure, vacancies can very easily occur in the structure. The compound can therefore deviate from semiconducting behavior as far as the occurrence of a metal-semiconductor transition, or metallic behavior. By subsequent heat treatment (so-called annealing), the order in these compounds is increased and the semiconducting behavior is thus improved.

Owing to an excess (deviation from the 1:1:1 stoichiometry) of one or more metallic elements, metallic inclusions occur in the semiconductor matrix, these metallic inclusions probably functioning as electrical short circuits and conducting the current well in the absence of a magnetic field. In a similar way to an EMR component, when the electric field is switched on there is an increase in the resistance. The applied magnetic field prevents penetration of the conduction electrons of the semiconductor matrix into the metallic inclusions, and the resistance is consequently increased in the magnetic field. If the compounds furthermore exhibit no ferro-, ferri- or antiferromagnetic behavior—i.e. they are paramagnetic—then they have a positive GMR effect at room temperature (23° C.) or even higher.

Compounds according to the invention are consequently such inorganic, intermetallic compounds as contain at least three elements per formula unit, consist of at least 2 phases (a main phase and a secondary phase)—i.e. they are inhomogeneous, at least one phase being semiconducting or having a metal-semiconductor transition, and have a magnetoresistance with an intrinsic field sensitivity of at least 0.1% per 0.1 T (preferably 1% per 0.1 T, particularly preferably 5% per 0.1 T). The main phase, which preferably constitutes at least 70 wt % (particularly preferably 80 wt %, more particularly preferably 90 wt %) of the overall phase system, is an intermetallic compound which has cubic symmetry with preferably no structural distortion, or at most slight structural distortion. Slight structural distortion is intended to mean a lattice parameter deviation of less than 10%, in particular <5%, preferably <2%. The cubic symmetry is determined to first approximation by the radius ratios of the atoms (R. C. Evans, Einführung in die Kristallchemie [Introduction to Crystal Chemistry], Walter de Gruyter Verlag Berlin New York 1976 p. 276). The elements and the stoichiometry are selected so that the resulting main phase belongs to the half-Heusler phases. It has furthermore been found necessary for the main phase to have 8 or 18 valence electrons. Semiconducting behavior or the presence of a metal-semiconductor transition is furthermore necessary. The main phase must be paramagnetic. The secondary phase(s) (preferably less than 30 wt %, <20, <10%) is (are) distributed randomly in the main phase. This involves metallic inclusions of arbitrary structure, which result from a metal used in excess during the production process and are not introduced afterwards. They consist of elements, or compounds of elements, which also occur in the main phase. The elements have a magnetoresistance (MR) effect above room temperature (=23° C.).

Inhomogeneous compounds according to the invention, which fulfill the conditions above, are therefore lutetium and lanthanum compounds with group VIIIb elements and metals or semimetals of main group V such as LuNiBi/Bi (=LuNiBi with an excess of Bi), LuNiSb/Sb, LaPdSb/Sb, LaPtBi/Bi or LuPtBi/Bi, or corresponding compounds with the same valence electron number, such as lutetium and lanthanum compounds with group Ib elements and metals or semimetals of main group IV, such as LuAuSn/Sn. All these compounds belong to the half-Heusler phases, have 18 valence electrons and are paramagnetic. LaNiSb/Sb, for example, is not an inhomogeneous compound according to the invention since the main phase no longer has cubic symmetry. DyNiBi/Bi is not an inhomogeneous compound according to the invention (even though it is cubic and of the half-Heusler type) since it exhibits antiferromagnetic behavior and therefore a negative GMR effect.

The compounds according to the invention surprisingly exhibit
- a high magnetoresistance MR (>10%, preferably >20%, particularly preferably >30%)
- at temperatures higher than room temperature, preferably at the normal operating temperature of read heads (up to 55° C., preferably up to 80° C., particularly preferably up to 150° C.),
- a large magnetoresistance effect even over a wide temperature range (>10° C., preferably >20° C., particularly preferably >30° C.),
- a high thermal decomposition stability (up to 55° C., preferably up to 80° C., particularly preferably up to 150° C.) and chemical stability (resistance to $H_2O$, $O_2$, and particularly preferably against alkalis and acids).

In order to produce the inhomogeneous compounds according to the invention, the selected elements are weighed in with the corresponding stoichiometry and, for example, melted by an arc welding device in an inert gas atmosphere. At least one element of the compound in question is added in a superstoichiometric amount of at most 30 wt % (expressed in terms of the weight of the total system) and then forms the secondary phase. Subsequent heat treatment has proven expedient.

The inhomogeneous compounds according to the invention are suitable for the production of read heads in storage media, or as magnetic field sensors, and may be employed in spin electronics.

The invention will be explained below with the aid of examples.

Production of the Inhomogeneous Compounds, and Measurement Methods

The compounds were synthesized from the elements according to the stoichiometric ratio with an excess of the Z element. The amount weighed in was melted for 30 seconds in a 700 mbar argon atmosphere using an arc welding device. This process was repeated several times in order to homogenize the samples. The weight loss was up to 15 wt %, depending on the elements used. These samples were then annealed for at least one week at temperatures of more than 700° C. in evacuated quartz ampoules. The structure and the purity of the product were studied using a transmission X-ray powder diffractometer (Siemens, D5000) with Cu—$K_\alpha$ radiation and using a scanning electron microscope (SEM), equipped with an energy-dispersive X-ray analyzer (EDX).

In order to study the magnetoresistance properties, conductivity measurements were carried out with and without an external magnetic field. The conductivity measurements were carried out on samples by means of the 4-point measurement technique using a Quantum Design PDMS model 6000. R(T) curves were recorded in a zero field and a magnetic field of 1 tesla. The B-field dependency of the conductivity was furthermore measured out at selected temperatures with applied magnetic fields of from −9 to +9 tesla.

EXAMPLE 1

LuNiBi/Bi Excess

The inhomogeneous compound was synthesized according to the stoichiometric ratio (1:1:1) from the elements (with a purity >99.9 wt %) plus a Bi excess of 10 wt % (expressed in terms of the total weight of the inhomogeneous compound) with a total weigh-in of 1 g. The weighed-in amount was melted and homogenized as described above. The weight loss was approximately 5 wt % (expressed in terms of the weigh-in). The LuNiBi phase exhibited minor "impurities".

Figure 2:
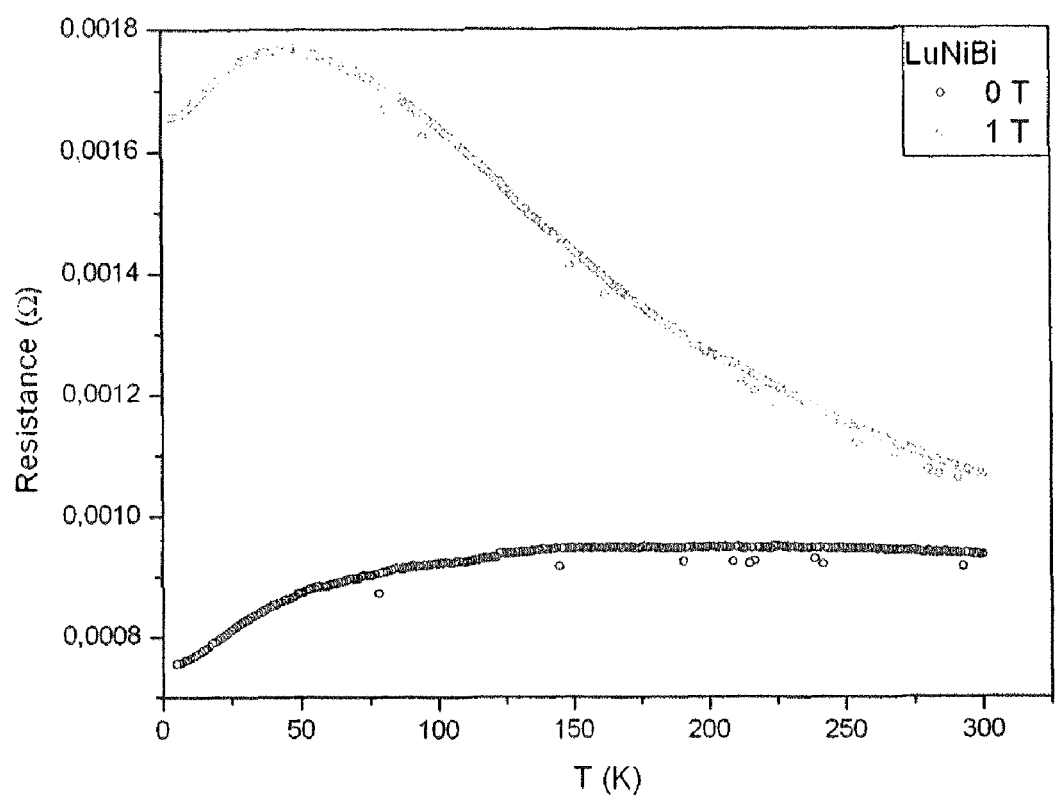
FIG. 2 is a graphical illustration of an RT curve for an exemplary LuNiBi/Bi-excess compound.
Figure 3:
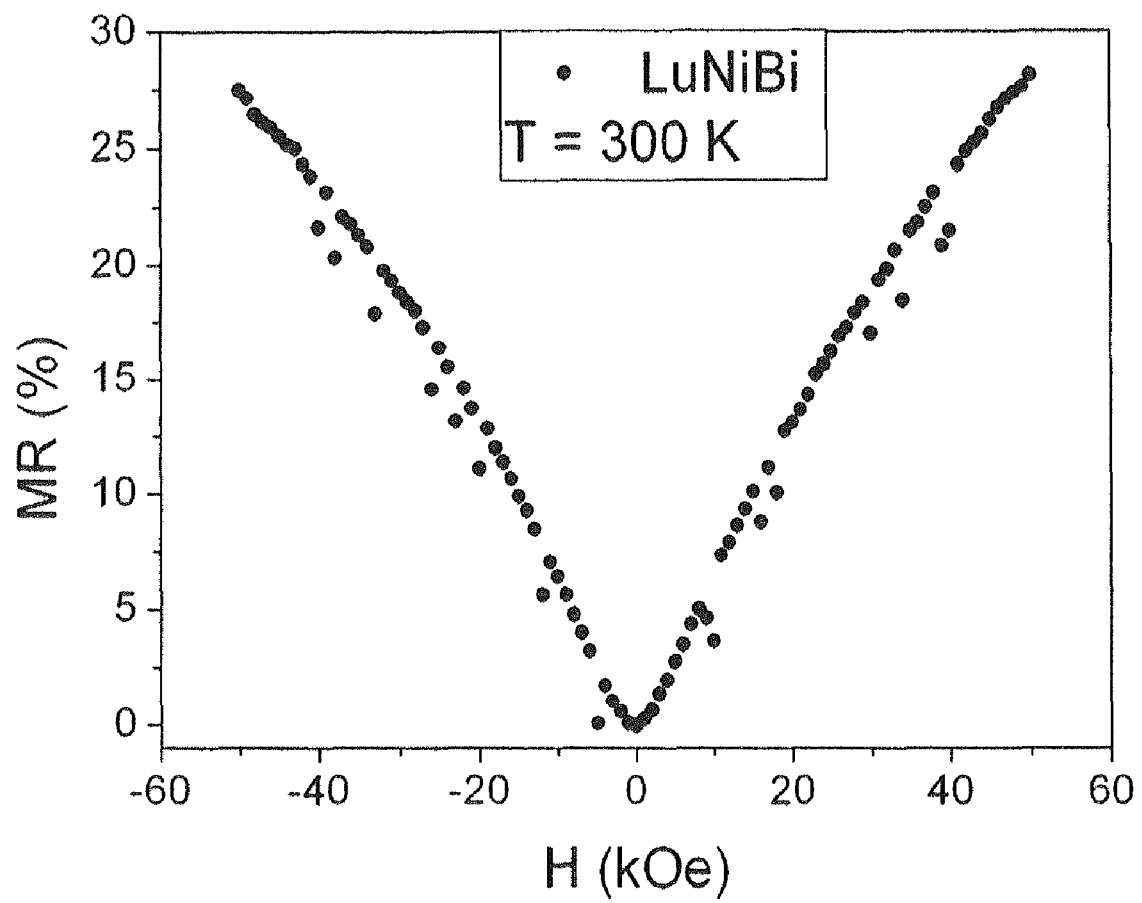
FIG. 3 is a graphical illustration of the field dependencey for an exemplary LuNiBi/Bi-excess compound.

FIG. 1 shows an SEM image of the LuNiBi/Bi-excess compound. The semiconducting matrix LuNiBi can be seen clearly, and the Bi "impurities" are marked by arrows. FIG. 2 shows the R(T) curve for 0 tesla and for 1 tesla. The resistance curve without an external magnetic field exhibits a very wide local maximum (metal-semiconductor transition) at 200 K. When a magnetic field is applied, the resistance increases significantly and the local maximum is now shifted toward a lower temperature of 50 K. Observation of the field dependency (FIG. 3) shows a change of 27.5% with an applied field of ±5 T and a temperature of 300 K.

The invention claimed is:

1. An inhomogeneous inorganic compound containing an overall phase system comprising a main phase and at least one secondary phase, of which
the main phase is an intermetallic compound,
wherein the intermetallic compound
has at least three elements per formula unit,
is semiconducting or has a metal-semiconductor transition,
has a magnetoresistance with an intrinsic field sensitivity of at least 0.1% per 0.1 T,
has cubic symmetry with a maximum structural distortion of 10%
belongs to half-Heusler phases
has 8 or 18 valence electrons and
is paramagnetic
and wherein the secondary phase
is metallic and comprises at least one element which occurs in the intermetallic compound.

2. The compound as claimed in claim 1, wherein the main phase constitutes at least 70 wt % of the overall phase system.

3. The compound as claimed in claim 1, wherein at least one secondary phase is distributed randomly in the main phase.

4. The compound as claimed in claim 1, wherein said compound has a magnetoresistance effect above 23° C.

5. The compound as claimed in claim 1, wherein the intermetallic compound is a lutetium or lanthanum compound with a group VIIIb element and a metal or semimetal of main group V.

6. The compound as claimed in claim 1, wherein the intermetallic compound is a lutetium or lanthanum compound with a group Ib element and a metal or semimetal of main group IV.

7. The compound as claimed in claim 5, wherein the intermetallic compound is LuNiBi, LuPtBi, LuPdBi, LuNiSb, LuPdSb, LuPtSb, LaPtBi or LaPdBi.

8. The compound as claimed in claim 6, wherein the intermetallic compound is LuAuSn or LuAuPb.

9. The compound as claimed in claim 1, wherein the magnetoresistance MR is positive.

10. A method for producing an inhomogeneous compound as claimed in claim 1 comprising combining three different elements to form the compound, at least one element present in excess,
wherein the type and amount of elements selected form compounds in which
the resulting compound is cubically crystallized with a maximum lattice parameter distortion of 10%,
the compound belongs to half-Heusler phases,
the compound is semiconducting or has a metal-semiconductor transition,
the compound has a magnetoresistance with an intrinsic field sensitivity of at least 0.1% per 0.1 T,
the compound has 8 or 18 valence electrons and
the compound is paramagnetic.

11. The method as claimed in claim 10, wherein said combining step comprises melting the three elements by an arc welding device in an inert gas atmosphere.

12. Read heads in storage media comprising the compounds as claimed in claim 1.

13. The compound as claimed in claim 1, wherein the overall phase system consists of the main phase and at least one secondary phase and the secondary phase consists of at least one element which occurs in the intermetallic compound.

* * * * *